(12) United States Patent
Sugiyama et al.

(10) Patent No.: US 7,847,028 B2
(45) Date of Patent: Dec. 7, 2010

(54) CURABLE COMPOSITION AND FLUORINATED CURED PRODUCT

(75) Inventors: Norihide Sugiyama, Chiyoda-ku (JP); Masahiro Ohkura, Chiyoda-ku (JP)

(73) Assignee: Asahi Glass Company, Limited, Tokyo (JP)

( * ) Notice: Subject to any disclaimer, the term of this patent is extended or adjusted under 35 U.S.C. 154(b) by 92 days.

(21) Appl. No.: 12/326,932

(22) Filed: Dec. 3, 2008

(65) Prior Publication Data

US 2009/0118429 A1    May 7, 2009

Related U.S. Application Data

(63) Continuation of application No. PCT/JP2007/061758, filed on Jun. 11, 2007.

(30) Foreign Application Priority Data

Jun. 12, 2006    (JP)    ............... 2006-162172

(51) Int. Cl.
- C08F 8/00    (2006.01)
- C08L 27/12   (2006.01)
- B32B 27/00   (2006.01)

(52) U.S. Cl. ............... 525/193; 525/194; 525/199; 428/421; 428/422

(58) Field of Classification Search ............... 525/193, 525/194, 199; 428/421, 422
See application file for complete search history.

(56) References Cited

U.S. PATENT DOCUMENTS

| 5,585,449 A | 12/1996 | Arcella et al. |
| 7,252,886 B2 * | 8/2007 | Sugiyama ............ 428/422 |
| 2001/0047115 A1 * | 11/2001 | Kashiwagi et al. ........ 568/615 |
| 2004/0019176 A1 | 1/2004 | Araki et al. |
| 2006/0183875 A1 | 8/2006 | Sugiyama et al. |
| 2006/0281883 A1 | 12/2006 | Sugiyama |

FOREIGN PATENT DOCUMENTS

| EP | 1 160 231 A1 | 12/2001 |
| JP | 02-084456 | 3/1990 |
| JP | 02-129254 | 5/1990 |
| JP | 05-230151 | 9/1993 |
| JP | 06-248026 | 9/1994 |
| JP | 08-012726 | 1/1996 |
| JP | 2000-001511 | 1/2000 |
| JP | 2003-008073 | 1/2003 |
| JP | 2006-104286 | 4/2006 |
| WO | 2002-18457 | 3/2002 |
| WO | 2005-037818 | 4/2005 |
| WO | WO 2005/042511 A1 | 5/2005 |
| WO | 2005-085303 | 9/2005 |

OTHER PUBLICATIONS

U.S. Appl. No. 12/488,654, filed Jun. 22, 2009, Matsuura, et al.

* cited by examiner

*Primary Examiner*—Nathan M Nutter
(74) *Attorney, Agent, or Firm*—Oblon, Spivak, McClelland, Maier & Neustadt, L.L.P.

(57) ABSTRACT

The present invention provides a curable composition which can yield a fluorinated cured product excellent in transparency, light resistance, heat resistance, and mechanical strength, and minimally damaged by stress concentration. The invention relates to a curable composition comprising a perfluoro polymer (a) containing a unit derived from a perfluorodiene having two polymerizable carbon-carbon double bonds, wherein two carbon atoms in one carbon-carbon double bond form the main chain, and the other carbon-carbon double bond forms a side chain; a perfluorocyclic monoene (b) having at least 8 carbon atoms, which has an alicyclic structure made of carbon atoms and optionally containing an oxygen atom, and one polymerizable carbon-carbon double bond, wherein at least one of two carbon atoms forming the carbon-carbon double bond is a carbon atom constituting the alicyclic structure; and a polymerization initiator (i).

17 Claims, 1 Drawing Sheet

CURABLE COMPOSITION AND FLUORINATED CURED PRODUCT

TECHNICAL FIELD

The present invention relates to:

(1) a curable liquid composition containing a perfluoro polymer containing a unit wherein a carbon-carbon double bond is present as a side chain;

(2) a fluorinated cured product obtained by curing the curable composition; and (3) a light-emitting device encapsulated in a light-transmitting manner with the fluorinated cured product.

BACKGROUND ART

An illumination light source with its light-emitting device encapsulated by a transparent epoxy resin emitting white light (hereinafter, white LED) after phosphor wavelength conversion of light emitting diodes (hereinafter, LEDs) emitting wavelengths of 467 nm (blue), 405 nm (violet blue), and 380 nm (ultraviolet rays), lacks durability because the transparent resin is deteriorated by the light and heat of the white LED.

A fluoro polymer with a fluorinated alicyclic structure on its main chain has a low refractive index and low surface energy and has excellent transparency, light resistance (especially durability against a short wavelength light), and chemical resistance, and it can be dissolved in a specific solvent. Therefore, a method of using the fluoro polymer for various applications as an adhesive or a coating agent which forms a coating film having the above properties, has been developed (cf. Patent Documents 1 and 2). Further, it has been suggested to use a coating film formed by the coating agent described in Patent Document 2, as a transparent resin to encapsulate a white LED (cf. Patent Document 3).

However, the coating agent described in Patent Document 3 is made of a fluoro polymer and a fluorinated solvent, and, since the maximum concentration of the fluoro polymer is around 25 mass %, the necessary thickness (at least 100 μm) to encapsulate LED cannot be obtained. Further, a method of applying the coating agent repeatedly to increase the thickness is also possible, but this method makes uniform encapsulation difficult in that during recoating, cracks are formed on a coating film, or foaming is likely to take place by volatilization of the solvent.

Further, a method of producing a molded product with excellent transparency and high transmittance of ultraviolet light by subjecting a fluoromonomer such as perfluoro(2,2-dimethyl-1,3-dioxol, or perfluoro(butenyl vinyl ether) to bulk polymerization using a polymerization initiator, has been developed (cf. Patent Document 4). However, since a polymer made of the fluoromonomer is a thermoplastic linear polymer, its heat resistance is not sufficient, and the fluoromonomer has a low boiling point such that when bulk polymerization is carried out, volume control of a molded product is difficult. Further, in radical bulk polymerization of the fluoromonomer, stress is caused by volume shrinkage, and in the encapsulation of the LED, the device or an electrode can be damaged, causing a decrease in light-emitting brightness, or a conduction failure.

Further, a method of encapsulating LED by curing a curable composition containing a perfluorocyclic polyene having at least 2 polymerizable carbon-carbon double bonds is known (cf. Patent Document 5).

Patent Document 1: JP-A-2-84456
Patent Document 2: JP-A-2-129254
Patent Document 3: JP-A-2003-8073
Patent Document 4: JP-A-2000-1511
Patent Document 5: WO2005/085303

DISCLOSURE OF THE INVENTION

Objects to be Accomplished by the Invention

The present invention provides a curable composition which gives a fluorinated cured product with excellent transparency, light resistance (especially light resistance against a short wavelength light of from 200 to 500 nm), heat resistance, mechanical strength, and minimizes damage by stress concentration. The present invention is also embodied in a fluorinated cured product obtained by curing the curable composition, or a light-emitting device encapsulated in a light-transmitting manner with the fluorinated cured product.

Means to Accomplish the Objects

The present invention provides a curable composition comprising a perfluoro polymer (a) containing a unit derived from a perfluorodiene having two polymerizable carbon-carbon double bonds, wherein two carbon atoms in one carbon-carbon double bond form the main chain, and the other carbon-carbon double bond forms a side chain; a perfluorocyclic monoene (b) having at least 8 carbon atoms, which has an alicyclic structure made of carbon atoms and optionally containing an oxygen atom, and one polymerizable carbon-carbon double bond, wherein at least one of two carbon atoms forming the carbon-carbon double bond is a carbon atom constituting the alicyclic structure; and a polymerization initiator (i).

The above composition preferably further contains a perfluorocyclic polyene (c) which has an alicyclic structure made of carbon atoms and optionally containing an oxygen atom, and at least two polymerizable carbon-carbon double bonds, wherein at least one of two carbon atoms forming at least one carbon-carbon double bond is a carbon atom constituting the alicyclic structure.

Further, the present invention provides a curable composition comprising a perfluoro polymer (a) containing a unit derived from a perfluorodiene having two polymerizable carbon-carbon double bonds, wherein two carbon atoms in one carbon-carbon double bond form the main chain, and the other carbon-carbon double bond forms a side chain; a perfluorocyclic polyene (c) which has an alicyclic structure made of carbon atoms and optionally containing an oxygen atom, and at least two polymerizable carbon-carbon double bonds, wherein at least one of two carbon atoms forming at least one carbon-carbon double bond is a carbon atom constituting the alicyclic structure; and a polymerization initiator (i).

The perfluoro polymer (a) preferably has a content of the double bonds from 0.1 to 2 mmol/g.

The perfluoro polymer (a) preferably has a mass average molecular weight of from 1,000 to 10,000.

The perfluoro polymer (a) preferably is a polymer further containing a unit derived from tetrafluoroethylene.

The perfluorocyclic monoene (b) preferably has an alicyclic structure made of a 5-membered ring or a 6-membered ring containing 1 or 2 oxygen atoms, wherein a carbon-carbon double bond is present between two adjacent carbon atoms constituting the alicyclic structure, or the carbon-carbon double bond is present between one carbon atom constituting the alicyclic structure and a carbon atom outside of the alicyclic structure.

The perfluorocyclic polyene (c) preferably has an alicyclic structure made of a 5-membered ring or a 6-membered ring containing 1 or 2 oxygen atoms, wherein a carbon-carbon double bond is present between two adjacent carbon atoms constituting the alicyclic structure, or the carbon-carbon double bond is present between one carbon atom constituting the alicyclic structure and a carbon atom outside of the alicyclic structure, and the polyene (c) has two such alicyclic structures wherein the carbon-carbon double bond is present.

Further, the present invention provides a fluorinated cured product obtained by curing the curable composition.

Further, the present invention provides an optical material made of the fluorinated cured product.

Further, the present invention provides a light-emitting device which is encapsulated in a light-transmitting manner with the fluorinated cured product.

Effects of the Invention

The curable composition of the present invention is capable of providing a fluorinated cured product excellent in transparency or light resistance (especially durability against a short wavelength light of from 200 to 500 nm). The fluorinated cured product of the present invention is excellent in heat resistance or mechanical resistance since it is an insoluble/infusible crosslinked polymer. Further, the curable composition of the present invention contains a perfluoro polymer (a), whereby flexibility will be imparted to a fluorinated cured product, and a light-emitting device encapsulated in a light-transmitting manner with the fluorinated cured product will endure less damage due to stress concentration.

MEANINGS OF SYMBOLS

Figure 1:
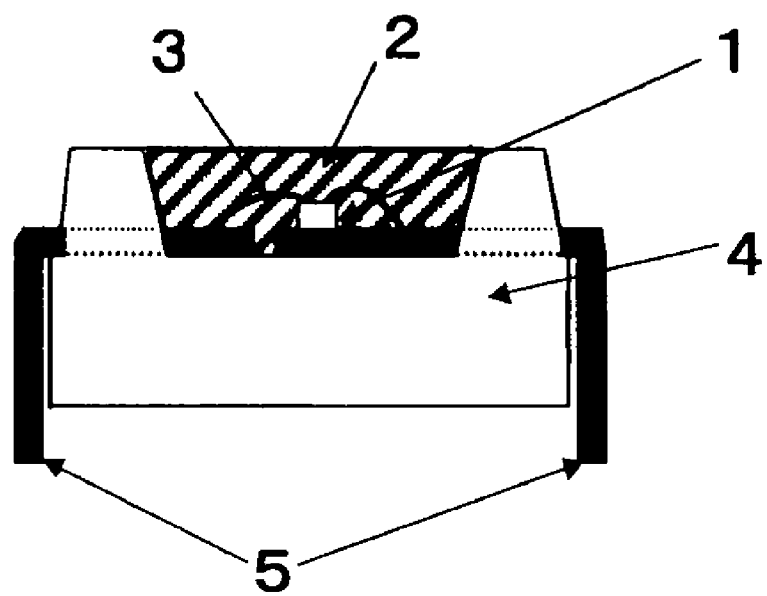
FIG. 1 is a cross-sectional view showing an LED chip which is one example of the light-emitting device of the present invention.

1: LED chip
2: Encapsulation resin
3: Bonding wire
4: Housing
5: Lead frame

BEST MODE FOR CARRYING OUT THE INVENTION

In the present specification, the compound represented by the formula (a) is referred to as compound (a). The same applies to compounds represented by other formulae.

In the present specification, "encapsulated in a light-transmitting manner" means encapsulation having both light transmitting and encapsulating functions.

In the present specification, "a unit in the polymer" means a monomer unit (also called a repeating unit) derived from a monomer and formed by polymerization of the monomer. Further, a group having a carbon atom chain such as a perfluoroalkyl group, a perfluoroalkylene group or a perfluoroalkoxy group, may be linear or branched.

Perfluoro polymer (a)

A perfluorodiene having two polymerizable carbon-carbon double bonds (hereinafter referred to simply as a perfluorodiene) to be used for polymerization for the perfluoro polymer (a) is constituted by carbon atoms and fluorine atoms, or by carbon atoms, fluorine atoms and oxygen atoms. The shortest chain to connect the two carbon-carbon double bonds of the perfluorodiene is preferably made of from 5 to 10 atoms. If the connecting chain is too short, intermolecular cyclization will take place during polymerization, and 4 carbon atoms of the two carbon-carbon double bonds will react with each other to form a main chain, whereby the polymer tends not to have the carbon-carbon double bond as a side chain. If the connecting chain is too long, one of the two carbon-carbon double bonds will remain as a side chain of the polymer, but a crosslinking reaction is likely to take place among the polymer molecules, whereby the polymer tends to have a high molecular weight or to turn into gel. Further, it is difficult to synthesize a perfluorodiene having a long connecting chain and to purify it to a high purity.

The perfluorodiene may be a perfluorocyclic diene having an alicyclic structure in its molecule, or a perfluoro noncyclic diene having no alicyclic structure in its molecule. One having no alicyclic structure in its molecule has a larger effect of imparting flexibility to a fluorinated cured product.

The above perfluorocyclic diene is the same perfluorocyclic diene as will be described later in the section for a perfluorocyclic polyene (c). Compound (c1) is particularly preferred. In such a compound, $Q^{F1}$ is a single bond, an oxygen atom or a $C_{1-10}$ perfluoroalkylene group which may contain an etheric oxygen atom. The carbon-carbon double bond in the side chain of the polymer having a unit derived from the compound (c1) has the advantage that it sufficiently reacts during a curing reaction, since it has a high radical polymerizability, and that it rarely lowers the thermal stability by remaining in a cured product. Further, a polymer having a unit derived from compound (c1) has high solubility and compatibility in the perfluorocyclic monoene (b) or a perfluorocyclic polyene (c), and thus has an advantage that it can be mixed with a high concentration.

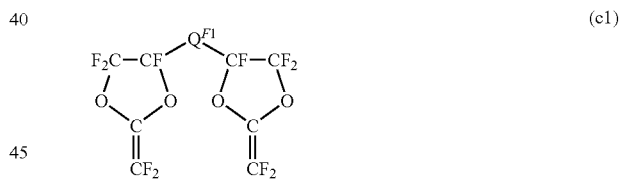

(c1)

As the above perfluoro noncyclic diene, the following compound is preferred:

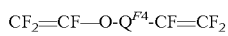

wherein $Q^{F4}$ represents a divalent perfluoro group which is a perfluoropolymethylene group which may contain a side chain of a perfluoroalkyl group, and the number of perfluoromethylene groups in the perfluoropolymethylene groups is from 5 to 10, and which may contain an etheric oxygen atom between carbon atoms or at the end of the group. The preferred $Q^{F4}$ is a $C_{4-10}$ perfluoropolymethylene group which contains no perfluoroalkyl side chain but contains an etheric oxygen atom at the end of the group.

Specific examples of the above perfluoro noncyclic diene may be the following compounds:

$$CF_2=CF-O-(CF_2)_6-O-CF=CF_2$$

$$CF_2=CF-O-(CF_2)_4-O-CF=CF_2$$

In the polymerization reaction, with some molecules of the perfluorodiene in the present invention, both of the two polymerizable carbon-carbon double bonds may be involved in the polymerization reaction. However, with some of the other molecules, one of two polymerizable carbon-carbon double bonds is involved in the polymerization reaction, and its two carbon atoms form a polymer main chain, and the other one is not involved in the polymerization reaction but remains as a side chain of the polymer. That is, the perfluoro polymer (a) in the present invention is a perfluoro polymer having a polymerizable carbon-carbon double bond. For example, the polymer having a unit derived from $CF_2=CF-OCF_2CF_2CF_2CF_2O-CF=CF_2$, has the following unit:

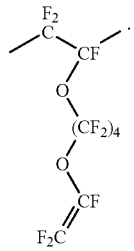

The content of the side chain having the polymerizable carbon-carbon double bond in the perfluoro polymer (a) is preferably from 0.1 to 2 mmol/g, more preferably from 0.5 to 2 mmol/g. The content may be determined by NMR. If the content is too small, at the time of curing the curable composition, the perfluoro polymer (a) tends to remain in the cured product without reacting with other composition components, and/or the perfluoro polymer (a) tends to bleed out, and the strength of the cured product tends to decrease. On the other hand, if the content is too large, during synthesis of the perfluoro polymer (a), a reaction or gelation between molecules will take place to make the polymer have a high molecular weight, and as a result, the solubility of the perfluoro polymer (a) in the curable composition tends to decrease.

The perfluoro polymer (a) preferably has a mass average molecular weight of from 1,000 to 10,000, more preferably from 1,500 to 5,000. The mass average molecular weight can be determined by gel permeation chromatography (GPC) as a molecular weight calculated as PMMA. If the molecular weight is too small, the volatilization of the perfluoro polymer (a) tends to be high, and if it is too high, the solubility in the curable composition tends to decrease.

At the temperature of curing the curable composition, the perfluoro polymer (a) is preferably one which is dissolved in the composition and provides a clear composition, and at room temperature (25° C.), it is particularly preferably in a liquid form or a grease form. In order to adjust the content of the side chain having the carbon-carbon double bond derived from the perfluorodiene and to suppress intermolecular reactions, such as gelation, the perfluoro polymer (a) may contain a unit derived from a perfluoro monoene or a unit derived from a cyclopolymerizable perfluorodiene monomer leaving no carbon-carbon double bond in the side chain of the polymer.

The perfluoro monoene is preferably: tetrafluoroethylene; a perfluoro monomer having an alicyclic structure, such as perfluoro(4-methyl-2-methylene-1,3-dioxolane) or perfluoro (2,2-dimethyl-1,3-dioxolane); or a perfluoro vinyl ether compound.

The perfluoro vinyl ether compound is preferably a compound represented by the following formula:

$$CF_2=CFOR^{F5},$$

wherein $R^{F5}$ is a $C_{1-10}$ perfluoroalkyl group which may contain an etheric oxygen atom. The perfluoro vinyl ether is particularly preferably the following compounds:

$$CF_2=CFO(CF_2)_nCF_3, \text{ or}$$

$$CF_2=CFO[CF_2CF(CF_3)O]_mCF_2CF_2CF_3,$$

wherein n is an integer of from 0 to 10, preferably from 0 to 2, and m is an integer of from 1 to 3, preferably 1 or 2. Specifically, $CF_2=CFOCF_3$, $CF_2=CFOCF_2CF_3$ or $CF_2=CFOCF_2CF_2CF_3$ are preferred.

Further, the perfluoro vinyl ether compound may be $CF_2=CFOCF_2CF_2CF_2COOH$, $CF_2=CFOCF_2CF(CF_3)OCF_2CF_2COOH$, $CF_2=CFOCF_2CF(CF_3)OCF_2CF_2SO_3H$, or $CF_2=CFOCF_2CF(CF_3)OCF_2CF_2CF_2CN$.

The cyclopolymerizable perfluorodiene monomer leaving no carbon-carbon double bond in the side chain of the polymer is preferably a cyclopolymerizable perfluorodiene monomer, such as perfluorobutenyl vinyl ether or perfluoroallyl vinyl ether.

Especially, the perfluoro polymer (a) is preferably a polymer containing a unit derived from tetrafluoroethylene. The reason is that the polymerization reaction will proceed at a suitable polymerization rate, that a polymer having a suitable molecular weight will be obtained by suppressing the reaction between molecules such as gelation, and that a polymer excellent in flexibility and thermal stability will be obtained.

Further, from the viewpoint of adjusting the content and molecular weight of the side chain having the carbon-carbon double bond, the perfluoro polymer (a) may contain a unit derived from a third monomer other than perfluorodiene and tetrafluoroethylene. The third monomer is preferably a perfluoromonoene other than the above tetrafluoroethylene, or a cyclopolymerizable perfluorodiene monomer leaving no carbon-carbon double bond in the polymer side chain.

When the perfluoro polymer (a) is a polymer containing a unit derived from tetrafluoroethylene, the charging ratio of tetrafluoroethylene:perfluorodiene is preferably from 1:99 to 85:15 (mass ratio). If the charging proportion of tetrafluoroethylene becomes too large, the molecular weight of a copolymer will be too high, whereby the solubility in the curable composition tends to be diminished.

When the perfluoro polymer (a) is a polymer containing a unit derived from tetrafluoroethylene and a unit derived from the third monomer, the unit derived from the third monomer is preferably contained in an amount of from 1 to 30 mass % of the polymer.

As the polymerization method to polymerize the perfluorodiene having two polymerizable carbon-carbon double bonds, it is possible to use a known polymerization method such as suspension polymerization, solution polymerization, emulsion polymerization, or bulk polymerization without any restriction, but the solution polymerization is particularly preferred since it is possible to carry out the polymerization in a state diluted with a solvent and to suppress the reaction between molecules by the carbon-carbon double bond of the side chain.

The polymerization medium for the solution polymerization is preferably a fluorinated solvent wherein a polymer to be synthesized will dissolve. The fluorinated solvent may, for example, be dichloropentafluoropropane (HCFC-225), $CF_3CH_2CF_2H$(HFC-245fa), $CF_3CF_2CH_2CF_2H$(HFC-365mfc), perfluorohexane, perfluorooctane or perfluoro(2-butyltetrahydrofuran).

As a polymerization initiator to be used in the polymerization reaction, it is possible to use most organic peroxides having a half-value temperature for 10 hours from 20 to 120° C., but since the reaction rate is lowered by a reaction to withdraw hydrogen atoms in the polymerization initiator, a fluorinated peroxide, such as fluorinated diacyl peroxide, is preferred.

The concentration of the polymerization initiator in the reaction solution is preferably from 0.1 to 5 mass %.

The polymerization temperature is selected depending on the half-value temperature for 10 hours of the initiator and the polymerization rate of the monomer, and it is preferably from 20 to 120° C., more preferably from 40 to 90° C.

In the polymerization reaction, it is preferred to use a chain transfer agent. The chain transfer agent may, for example, be a chlorine compound such as $CCl_4$, $CH_3Cl$, $SO_2Cl_2$, or $CHFCl_2$, or a hydrocarbon compound, such as methanol, ethanol, isopropanol, hexane, or diethyl ether. Particularly, $SO_2Cl_2$ is preferred since the chain transfer efficiency is good, and a polymer can be obtained in high yield.

The amount of the chain transfer agent to be used depends on the chain transfer constant, but when $SO_2Cl_2$ is used, the amount is preferably from 0.1 to 10 by molar ratio based on the total amount of the mixture of tetrafluoroethylene and perfluorodiene. If the amount of the chain transfer agent is too small, the molecular weight of the polymer tends to be too high. If the amount of the chain transfer agent is too large, the molecular weight of the polymer tends to be too low.

Perfluorocyclic Monoene (b)

The alicyclic structure in the perfluorocyclic monoene (b) is constituted by only carbon atoms or by carbon atoms and oxygen atoms. The alicyclic structure is preferably constituted by 4 to 8 atoms, more preferably 5 or 6 atoms, particularly preferably a 5-membered ring or 6-membered ring containing 1 or 2 oxygen atoms. The perfluorocyclic monoene (b) has at least one such alicyclic structure, particularly preferably one such structure.

To carbon atoms constituting the alicyclic structure, a substituent other than fluorine atoms may be bonded. The substituent is preferably: a perfluoroalkyl group having at most 15 carbon atoms; a perfluoroalkyl group having an etheric oxygen atom between carbon atoms (the etheric oxygen atom may be more than one) and at most 15 carbon atoms; a perfluoroalkoxy group having at most 15 carbon atoms; or a perfluoroalkoxy group having an etheric oxygen atom between carbon atoms (the etheric oxygen atom may be more than one) and at most 15 carbon atoms.

The perfluorocyclic monoene (b) has one polymerizable carbon-carbon double bond, wherein at least one of two carbon atoms forming the carbon-carbon double bond is a carbon atom constituting the above alicyclic structure. That is, a carbon-carbon double bond is present between two adjacent carbon atoms constituting the above alicyclic structure, or a carbon-carbon double bond is present between one carbon atom constituting the above alicyclic structure and a carbon atom outside of the above alicyclic structure.

The perfluorocyclic monoene (b) has at least 8 carbon atoms, preferably at least 10 carbon atoms. The perfluorocyclic monoene (b) satisfying such a condition has a boiling point of at least 100° C., which is preferred for curing in an open system.

The alicyclic structure having a carbon-carbon double bond is preferably a perfluoro(2-methylene-1,3-dioxolane) structure or a perfluoro-1,3-dioxol structure. The perfluorocyclic monoene (b) is preferably a perfluoro(2-methylene-1,3-dioxolane) (cf. compound (b1)) having a substituent such as a perfluoroalkyl group which may contain an etheric oxygen atom at least at one of 4- and 5-positions, or a perfluoro-1,3-dioxol (cf. compound (b2)) having one or two monovalent substituents, such as a perfluoroalkyl group, at the 2-position or having a divalent substituent, such as a perfluoroalkylene group, which may contain an etheric oxygen atom at the 2-position.

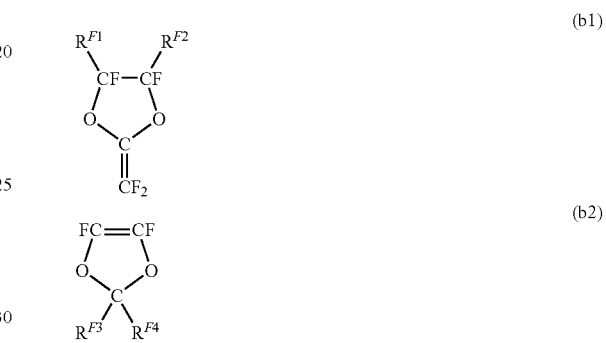

However, each of $R^{F1}$ and $R^{F2}$ is independently a fluorine atom, a $C_{1-14}$ perfluoroalkyl group which may contain an etheric oxygen atom between carbon atoms or a $C_{1-14}$ perfluoroalkoxy group which may contain an etheric oxygen atom between carbon atoms. However, at least one of $R^{F1}$ and $R^{F2}$ is a perfluoroalkyl group, and the sum of carbon atoms of $R^{F1}$ and $R^{F2}$ is at least 4. Further, $R^{F1}$ and $R^{F2}$ may together form a $C_{4-14}$ perfluoroalkylene group which may contain an etheric oxygen atom. $R^{F1}$ is preferably a fluorine atom, and $R^{F2}$ is preferably a $C_{4-14}$ perfluoroalkylene group which may contain an etheric oxygen atom.

Each of $R^{F3}$ and $R^{F4}$ is independently a fluorine atom or a $C_{1-15}$ perfluoroalkyl group which may contain an etheric oxygen atom. However, at least one of $R^{F3}$ and $R^{F4}$ is a perfluoroalkyl group, and the sum of carbon atoms of $R^{F3}$ and $R^{F4}$ is at least 5. Further, $R^{F3}$ and $R^{F4}$ may together form a $C_{5-15}$ perfluoroalkylene group which may contain an etheric oxygen atom. $R^{F3}$ is preferably a trifluoromethyl group, and $R^{F4}$ is preferably a $C_{4-14}$ perfluoroalkylene group which may contain an etheric oxygen atom.

Compound (b1) is preferably compound (b11) or compound (b12). However, $R^{Fa}$ is a $C_{4-14}$ perfluoroalkyl group, and $R^{Fb}$ is a $C_{4-14}$ perfluoro(alkoxyalkyl) group.

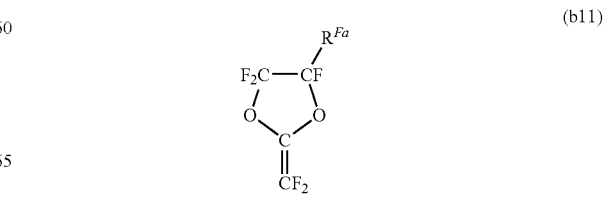

(b12)

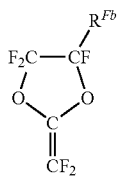

Compound (b11) is preferably produced by the method described in JP-A-5-213929 or JP-A-5-339255. Specific examples of compound (b11) may be the following compounds:

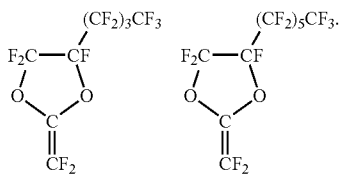

Compound (b12) is preferably produced by the method described in WO2005/085303. Specific examples of compound (b12) may be the following compounds:

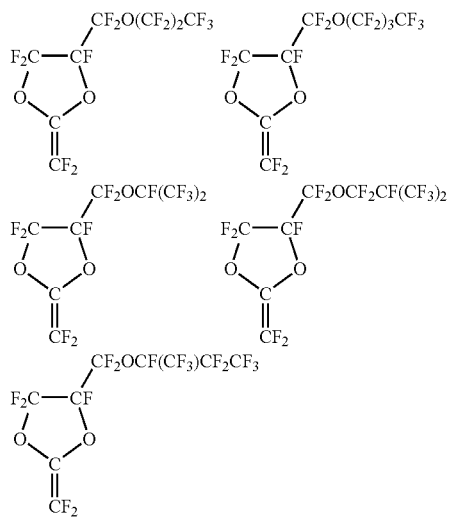

Specific examples of compound (b2) may be the following compounds, preferably produced by the method described in JP-A-4-346989 or WO2004/088422:

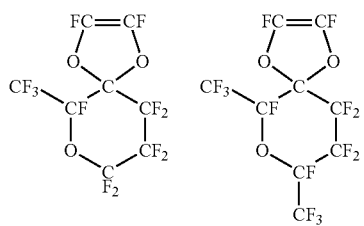

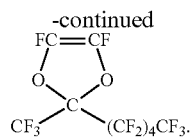

Perfluorocyclic Polyene (c)

The alicyclic structure in the perfluorocyclic polyene (c) is constituted by only carbon atoms or by carbon atoms and oxygen atoms. The alicyclic structure is preferably constituted by 4 to 8 atoms, more preferably 5 or 6 atoms, particularly preferably a 5-membered ring or 6-membered ring containing 1 or 2 oxygen atoms. The perfluorocyclic polyene (c) has at least one such alicyclic structure, particularly preferably one or two such structures. When it has at least two alicyclic structures, such two or more alicyclic structures may be connected by a single bond or a divalent or higher valent connecting group, or may be condensed (including a case of sharing one carbon atom). The connecting group may, for example, be an oxygen atom, a perfluoroalkylene group (the number of carbon atoms is preferably at most 8), or a perfluoroalkylene group (the number of carbon atoms is preferably at most 8) having an etheric oxygen atom at one end, both ends, or between carbon atoms.

To carbon atoms constituting the alicyclic structure, a substituent other than fluorine atoms may be bonded. The substituent is preferably a perfluoroalkyl group having at most 15 carbon atoms, a perfluoroalkyl group having an etheric oxygen atom between carbon atoms (the etheric oxygen atom may be more than one) and at most 15 carbon atoms, a perfluoroalkoxy group having at most 15 carbon atoms, or a perfluoroalkoxy group having an etheric oxygen atom between carbon atoms (the etheric oxygen atom may be more than one) and at most 15 carbon atoms.

The perfluorocyclic polyene (c) has at least two polymerizable carbon-carbon double bonds, wherein at least one of two carbon atoms forming at least one carbon-carbon double bond is a carbon atom constituting the alicyclic structure. That is, a carbon-carbon double bond is present between two adjacent carbon atoms constituting the alicyclic structure, or a carbon-carbon double bond is present between one carbon atom constituting the alicyclic structure and a carbon atom outside of the alicyclic structure. Two or more such carbon-carbon double bonds may be contained in one alicyclic structure, but one alicyclic structure preferably has one carbon-carbon double bond.

Therefore, the perfluorocyclic polyene (c) having at least two such carbon-carbon double bonds is preferably a compound having at least two alicyclic structures wherein a carbon-carbon double bond is present (hereinafter referred to as an alicyclic structure combined with a carbon-carbon double bond). The perfluorocyclic polyene (c) has at least one alicyclic structure combined with a carbon-carbon double bond, and it may further have a carbon-carbon double bond of any other structure (which is a carbon-carbon double bond made of two carbon atoms not constituting the above alicyclic structure).

The perfluorocyclic polyene (c) preferably has 2 to 4 carbon-carbon double bonds (at least one of them is a carbon-carbon double bond combined with an alicyclic structure), particularly preferably 2 carbon-carbon double bonds combined with alicyclic structures (no other polymerizable carbon-carbon double bonds are contained). In the present specification, the perfluorocyclic polyene (c) having 2 carbon-carbon double bonds combined with alicyclic structures is referred to as a perfluorocyclic diene.

The number of carbon atoms of the perfluorocyclic polyene (c) is at least 8, preferably at least 10, and its upper limit is at most 24, preferably at most 18, from the viewpoint of its boiling point or heat resistance of a fluorinated cured product to be obtained. A perfluorocyclic polyene (c) satisfying such a condition, has a boiling point of at least 100° C., such being preferred for curing in an open system.

In the perfluorocyclic polyene (c), the perfluorocyclic diene is preferably a compound having 2 perfluoro(2-methylene-1,3-dioxolane) structures, particularly preferably a compound (cf. compound (c1)) having the two rings connected by a single bond or a divalent connecting group with their 4-positions as connecting positions, or a compound (cf. compound (c2)) having the two rings condensed by single bonds or divalent connecting groups with their 4- and 5-positions as connecting positions. As another perfluorocyclic polyene (c), compound (c3) may be mentioned.

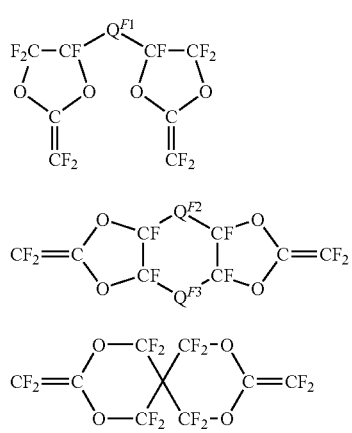

In the above formula, $Q^{F1}$ is a single bond, an oxygen atom, or a $C_{1-10}$ perfluoroalkylene group which may contain an etheric oxygen atom. Each of $Q^{F2}$ and $Q^{F3}$ is independently a single bond, an oxygen atom, or a $C_{1-5}$ perfluoroalkylene group which may contain an etheric oxygen atom.

Compound (c1) is preferably produced by a method described in WO2005/085303. Specific examples of compound (c1) may be the following compounds:

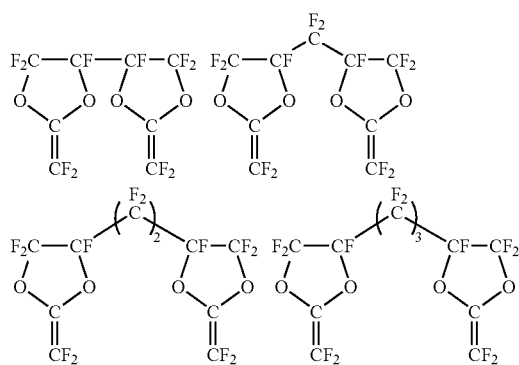

-continued

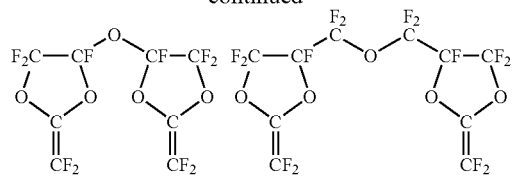

Polymerization Initiator (i)

The curable composition of the present invention contains the polymerization initiator (i). The amount of the polymerization initiator (i) in the curable composition is preferably from 0.01 to 1 mass % from the viewpoint that curing is smoothly accelerated, and that the decomposition residue of the polymerization initiator does not affect heat resistance or transparency of the fluorinated, cured product. The polymerization initiator (i) is preferably a fluorinated organic peroxide, having a half-value temperature for 10 hours from 0 to 150° C., from the viewpoint that the decomposition residue of the polymerization initiator does not impair the transparency, light resistance, heat resistance, etc., of the fluorinated, cured product.

The fluorinated organic peroxide may, for example, be a fluorinated diacyl peroxide, a fluorinated peroxydicarbonate, a fluorinated peroxyester, or a fluorinated dialkyl peroxide.

The fluorinated diacyl peroxide may be at least one of the following compounds (hereinafter, $C_6F_5$ shows a perfluorophenyl group):

$(C_6F_5C(O)O)_2$;

$(C_6F_5C(CH_3)_2C(O)O)_2$;

$(CF_3OCF_2CF_2C(O)O)_2$;

$(CF_3CH_2C(O)O)_2$;

$((CF_3)_2CHC(O)O)_2$; or $((CF_3)_3CC(O)O)_2$.

The fluorinated peroxydicarbonate may be at least one of the following compounds:

$((CF_3)_2CHOC(O)O)_2$;

$(CF_3(CF_2)_nCH_2OC(O)O)_2$;

$(C_6F_5OC(O)O)_2$; or $(C_6F_5CH_2OC(O)O)_2$.

The fluorinated peroxyester may be at least one of the following compounds:

$CF_3CF_2CH_2OOC(O)C(CF_3)_3$;

$(CF_3)_2CHOOC(O)C(CF_3)_3$;

$(CF_3)_2CHOOC(O)CH_2CF_2CF_3$;

$CF_3CF_2CHOOC(O)CH_2CF_2CF_3$;

$CF_3CF_2CHOOC(O)C_6F_5$; or $(CF_3)_2CHOOC(O)C_6F_5$.

The fluorinated dialkyl peroxide may be at least one of the following compounds:

$(CF_3C_6F_4C(CF_3)_2O)_2$;

$(CF_3)_3CO)_2$; or $C_6F_5C(CF_3)_2O\text{—}OC(CF_3)_3$.

Curable Composition

As the curable composition of the present invention, types (I) to (III) are mentioned:

(I) curable composition containing the perfluoro polymer (a), and perfluorocyclic monoene (b), as the curable components;

(II) curable composition containing the perfluoro polymer (a), and perfluorocyclic polyene (c), as the curable components; and (III) curable composition containing the perfluoro polymer (a), perfluorocyclic monoene (b), and perfluorocyclic polyene (c), as the curable components.

(I) The ratio of the perfluoro polymer (a) to the perfluorocyclic monoene (b) in the curable composition (total is 100 parts by mass) is preferably such that (a)/(b)=(5 to 95)/(5 to 95), more preferably (50 to 90)/(10 to 50), by mass ratio.

(II) The ratio of the perfluoro polymer (a) to the perfluorocyclic polyene (c) in the curable composition (total is 100 parts by mass) is preferably such that (a)/(c)=(5 to 95)/(5 to 95), more preferably (50 to 90)/(50 to 10), by mass ratio.

(III) The ratio of the perfluoro polymer (a), perfluorocyclic monoene (b) and the perfluorocyclic polyene (c) in the curable composition (total is 100 parts by mass) is preferably such that (a)/(b)/(c)=(5 to 95)/(2 to 80)/(2 to 50), more preferably (50 to 90)/(5 to 45)/(5 to 30), by mass ratio.

If the proportion of the perfluoro polymer (a) is too large, curing tends to be insufficient, and if it is too small, volume shrinkage during curing or damaging a cured product by stress concentration tends to take place.

By incorporating the perfluorocyclic monoene (b), it is possible to increase the glass transition temperature (Tg) or hardness of the fluorinated cured product, and it is possible to control Tg or hardness by adjusting the content.

By incorporating the perfluorocyclic polyene (c), the heat resistance of the cured product may be improved.

The proportion of the polymerization initiator to the total mass of the curable composition is preferably from 0.1 to 10 mass %, and more preferably from 0.5 to 2 mass %. If the polymerization initiator is too small, curing will be insufficient, and the proportion of the unreacted curing components will be large, whereby the thermal stability of the fluorinated cured product tends to be low. If the polymerization initiator is too large, the fluorinated cured product tends to be colored.

Before being cured, the curable composition of the present invention, may contain a solvent, but at the time of curing, it preferably contains substantially no solvent. The reason is that by volatilization of the solvent during and after curing, volume shrinkage of the fluorinated cured product may take place, stress may be caused on a device encapsulated in a light-transmitting manner with the fluorinated cured product, and peeling of the fluorinated cured product may take place. In its form before being cured, the composition may contain a solvent used to disperse and dissolve the components other than the curable components. For example, the fluorinated organic peroxide is usually dispersed in a solvent such as dichloropentafluoropropane because it has a low decomposition temperature. Therefore, in order to blend the fluorinated organic peroxide to a curable composition or the like, a composition containing the solvent is prepared, and then, the solvent is removed to obtain a curable composition containing substantially no solvent at the time of curing.

A silane coupling agent is preferably incorporated into the curable composition, as the case requires. The reason for this is that the adhesion to a substrate of a fluorinated cured product formed from the composition will be improved. Specific examples of the silane coupling agent may be the following:

Tetraethoxysilane; 3-glycidoxypropyl trimethoxysilane; methyltrimethoxysilane; vinyl trimethoxysilane; 3-methacryloyloxypropyl trimethoxysilane; 3-chloropropyl trimethoxysilane; 3-mercaptopropyl trimethoxysilane; 3-aminopropyl triethoxysilane; heptadecafluorooctyl ethyl trimethoxysilane; 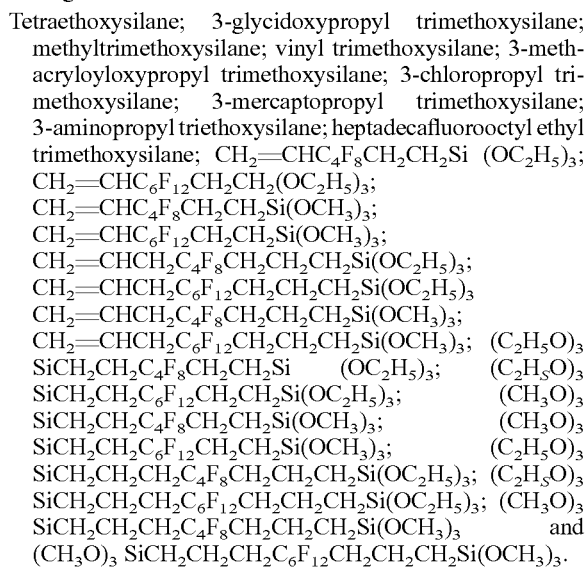

Fluorinated Cured Product

In the process of the present invention, curing can be carried out by any known method. For example, curing by heat and/or irradiation with ultraviolet rays may be employed. The temperature for curing is preferably from 0 to 200° C. Further, the temperature for curing is preferably changed in a stepwise manner to let the curing proceed in a stepwise manner in order to decrease the volume shrinkage accompanying the curing.

A fluorinated cured product obtained by curing the curable composition of the present invention has high light resistance (especially durability against short wavelength light having a wavelength of from 200 to 500 nm) and transparency, and it has excellent heat resistance. Therefore, the fluorinated cured product of the present invention is useful as an optical material.

That is, the present invention provides an optical material made of the above fluorinated cured product. The optical material may be used for an application to a core material or clad material of optical fiber, a core material or clad material of an optical waveguide, a pericle material, a surface protecting material for a display (e.g., PDP, LCD, FED, or an organic EL), a surface protecting material for a lens (e.g., a condensing lens for a light-emitting device, an artificial crystalline lens, a contact lens, or a low refractive index lens), a material for a lens (e.g., a condensing lens for a light-emitting device, an artificial crystalline lens, a contact lens or a low refractive index lens), or a sealing material for a device (e.g., a light-emitting device, a solar cell device or a semiconductor device).

The optical material of the present invention is preferably used as a molded product made of a fluorinated cured product having an optional form (e.g., a plate-form, a tube form, a stick form, etc.) obtained by curing the curable composition of the present invention in an optional form of mold, or as a coating film of the fluorinated cured product to encapsulate an optional substrate in a light-transmitting manner, which is formed by curing the curable composition or the like of the present invention on an optional substrate (e.g., the above display, lens, device, etc.).

The molded product is preferably a core and/or clad material of optical fiber, a core and/or clad material of an optical waveguide, or a material for a lens.

The coating film is preferably a sealing material for a device. For example, it could be a sealing material to encapsulate a solar cell device or a light-emitting device (e.g., LED, laser diode (LE), an electroluminescence device, etc.), and from the viewpoint that the fluorinated cured product of the present invention has the above properties, it is particularly preferably a sealing material to encapsulate a short wavelength light-emitting device in a light-transmitting manner. An example of a short wavelength light-emitting device, is a white LED.

That is, the present invention provides a light-emitting device encapsulated in a light-transmitting manner with the optical material of the present invention. When the light-emitting device of the present invention is a short wavelength light-emitting device having a wavelength of from 200 to 500 nm, it is possible to add, for example, a phosphor for changing a light-emitting wavelength of LED to the curable composition of the present invention, as the case requires.

FIG. 1 shows an embodiment of the optical device of the present invention. FIG. 1 is a schematic partially cross-sectional view of the short wavelength light-emitting device. The structure of the short wavelength light-emitting device may be a chip form as shown in FIG. 1 or a cannonball form. In the short wavelength light-emitting device shown in FIG. 1, a heat resistant resin or ceramic housing 4 is equipped with a conductive lead frame 5; on an inner lead of the lead frame 5, a LED chip 1 is bonded with a die-bonding agent, such as a conductive paste; electrodes on the LED chip 1 and the inner lead of the lead frame 5 are connected by a bonding wire 3 for conduction, and the entirety is encapsulated in a light-transmitting manner with a sealing resin 2. As the sealing resin 2, the fluorinated cured product of the present invention is used. Light emitted by the LED chip 1 is transmitted through the sealing resin 2 and goes out of the optical device. The term "encapsulated in a light-transmitting manner" means sealing with such a sealing resin having a function of transmitting light.

The fluorinated cured product of the present invention has excellent chemical resistance against a chemical solution (e.g., an acid such as sulfuric acid, hydrochloric acid, or an organic acid, an alkaline solution such as aqueous caustic soda or aqueous ammonia, or an organic solvent, such as an alcohol, a ketone, or an ester), and thus it is useful as a sealing material for a device for treatment of such a chemical solution. Further, the fluorinated cured product of the present invention is also excellent in moisture resistance, whereby it is also useful as a moisture resistant sealing material and a sealing material for a liquid crystal display cell, an organic solar cell or an organic EL device cell. The fluorinated cured product of the present invention also has excellent light resistance, whereby it can also be used as a weather resistant sealing material for, for example, an electronic device to be used outside.

Further, the fluorinated cured product of the present invention can be used as a fuel system sealing material for a vehicle, a chemical plant, fuel storage, fuel transportation, fuel cell, electrical power generation, household product or air craft, or as a fuel system sealing material which is a diaphragm, valve, O-ring, oil seal, gasket, or packing.

EXAMPLES

Now, the present invention will be described in further detail with reference to Examples, but it should be understood that the step of the present invention is by no means restricted to the Examples. In the Examples, the content of double bonds in the perfluoro polymer was measured by $^{19}$F-NMR, and further the mass average molecular weight was obtained as a molecular weight calculated as PMMA by gel permeation chromatography (GPC) using $CF_2ClCF_2CHClF$ (AK225cb manufactured by Asahi Glass Company, Limited, hereinafter referred to as AK225cb) as a solvent. The glass transition temperature (Tg) of the fluorinated cured product was measured by a differential scanning calorimatry (DSC) at a temperature raising rate of 10° C./min.

Synthesis Example 1

Preparation of Perfluoro Polymer (a-1)

A 500 mL stainless steel autoclave equipped with a stirrer was deaerated, and $CF_2$=$CFOC_4F_8OCF$=$CF_2$ (79 g), AK225cb (100 g), $SO_2Cl_2$ (2.7 g), perfluorocyclohexane carbonyl peroxide (1 g) and tetrafluoroethylene (hereinafter referred to as TFE) (22 g) were injected therein. The temperature inside of the autoclave was increased to 50° C. with stirring, and then a reaction was carried out for 5 hours.

The autoclave was cooled, and the content was taken out and transferred into a 2 L glass beaker. With stirring, 500 g of methanol was added to precipitate a polymer. After the supernatant was removed, the rest was dissolved in AK225 again, and filtration by a polytetrafluoroethylene (hereinafter referred to as PTFE) membrane filter having a pore diameter of 1 μm, was carried out. The obtained polymer solution was subjected to distillation of the solvent by using an evaporator, whereby 79 g of perfluoro polymer (a-1) was obtained in a form of a colorless transparent high viscosity liquid. The mass average molecular weight of the perfluoro polymer (a-1) was measured by using GPC and found to be 1,600. Further, the content of double bonds in the perfluoro polymer (a-1) was obtained by NMR and found to be 0.7 mmol/g.

Synthesis Example 2

Preparation of Perfluoro Polymer (a-2)

A 500 mL stainless steel autoclave equipped with a stirrer was deaerated, and diene compound (c-1) (39 g), AK225 (100 g), $SO_2Cl_2$ (2.7 g), diisopropyl peroxydicarbonate (1 g) and TFE (23 g) were injected therein. The temperature inside of the autoclave was increased to 50° C. with stirring, and then a reaction was carried out for 5 hours.

The autoclave was cooled, and the content was taken out and transferred into a 2 L glass beaker. With stirring, methanol (500 g) was added to precipitate a polymer. After the supernatant was removed, the rest was dissolved in AK225 again, and filtration by a polytetrafluoroethylene (hereinafter referred to as PTFE) membrane filter having a pore diameter of 1 μm, was carried out. The obtained polymer solution was subjected to distillation of the solvent by using an evaporator, whereby 45 g of perfluoro polymer (a-2) was obtained in a form of a colorless transparent high viscosity liquid. The mass average molecular weight of the perfluoro polymer (a-2) was measured by using GPC and found to be 1,400. Further, the content of double bonds in the perfluoro polymer (a-2) was obtained by NMR and found to be 0.36 mmol/g.

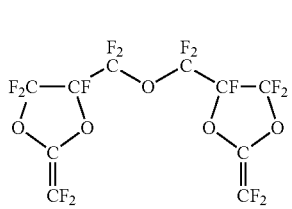

(c-1)

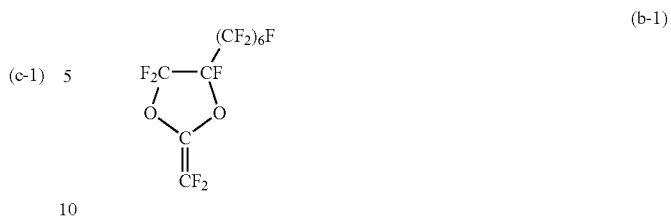

(b-1)

Synthesis Example 3

Preparation of Perfluoro Polymer (a-3)

A 500 mL stainless steel autoclave equipped with a stirrer was deaerated, and $CF_2=CFOC_4F_8OCF=CF_2$ (20 g), AK225cb (400 g), $SO_2Cl_2$ (5 g), $CF_2=CFOC_3F_7$(60 g), perfluorocyclohexane carbonyl peroxide (5 g) and TFE (18 g) were injected therein. The temperature inside of the autoclave was increased to 50° C. with stirring, and then a reaction was carried out for 5 hours.

The autoclave was cooled, and the content was taken out and transferred into a 2 L glass beaker. With stirring, 500 g of methanol was added to precipitate a polymer. After the supernatant was removed, the rest was dissolved in AK225 again, and filtration by a polytetrafluoroethylene (hereinafter referred to as PTFE) membrane filter having a pore diameter of 1 μm, was carried out. The obtained polymer solution was subjected to distillation of the solvent by using an evaporator, whereby 35 g of perfluoro polymer (a-3) was obtained in a form of a colorless transparent high viscosity liquid. The mass average molecular weight of the perfluoro polymer (a-3) was measured by using GPC and found to be 3,400. Further, the content of double bonds in the perfluoro polymer (a-3) was obtained by NMR and found to be 0.5 mmol/g.

Example 1

A composition comprising the liquid form perfluoro polymer (a-1) obtained in Synthesis Example 1 (20 parts), the following compound (b-1) (69 parts), the above compound (c-1) (8 parts), vinyl trimethoxysilane (3 parts) and $(C_6F_5C(O)O)_2$ (0.2 part), was prepared. Then, such a composition was heated at 60° C. for 1 hour to obtain a syrup-form composition having a viscosity of from 100 to 200 cps (at room temperature).

Into a mold form having a spacer made of a silicone rubber sheet sandwiched between 2 glass plates, the syrup-form composition was poured, and in an atmosphere of $N_2$, heating was carried out sequentially at 60° C. for 2 hours, at 70° C. for 2 hours, at 90° C. for 2 hours and further at 120° C. for 1 hour, and then the mold form was removed to obtain a plate-form cured product of a 2 cm square having a thickness of 1 mm. Tg of such a cured product was measured by DSC and found to be 88° C. Further, the light transmittance of the cured product at 460 nm was 93%.

Into a concave portion of a cup-form LED device having GaN type LED (emission wavelength: 460 nm) wire-bonded as shown in FIG. 1, the above syrup type composition was injected, and heating was carried out sequentially at 60° C. for 2 hours, at 70° C. for 2 hours, at 90° C. for 2 hours and further at 120° C. for 1 hour, whereby the LED device was encapsulated.

The emission intensity was measured by using an integral spherical form illuminance meter when 17.5 mA direct current was applied on the LED device. The voltage at the time of measuring was 3.52 V, and the emission output was 4.7 mW. The LED device was subjected to a thermal stress test twice at 260° C. for 30 seconds, and then the emission intensity was again measured. The voltage was 3.52 V, and the emission output was 4.7 mW, with no changes. Then, the LED device was kept at −40° C. for 30 minutes, then at 120° C. for 30 minutes, and further it was cooled to −40° C. Such a temperature cycle was repeated 300 times, and then the emission output was measured and found to be 4.5 mW, with no substantial change.

Example 2

A composition comprising the liquid form perfluoro polymer (a-2) obtained in Synthesis Example 2 (25 parts), the compound (b-1) (64 parts), the compound (c-1) (8 parts), $CH_2=CHCH_2C_6F_{12}CH_2CH_2CH_2Si(OC_2H_5)_3$ (3 parts) and $(C_6F_5C(O)O)_2$ (0.2 part), was prepared. Then, such a composition was heated at 60° C. for 1 hour to obtain a syrup-form composition having a viscosity of from 100 to 200 cps (at room temperature). In the same manner as in Example 1, a plate-form cured product was formed from the syrup-form composition. Tg of the cured product was measured by DSC and found to be 90° C. Light transmittance of the cured product at 460 nm was 92%.

By using the syrup-form composition, an LED device was encapsulated in the same manner as in Example 1. The emission intensity was measured by using an integral spherical form illuminance meter when 17.5 mA direct current was applied on the LED device. The voltage at the time of measuring was 3.53 V, and the emission output was 4.2 mW. Then, LED device was subjected to a thermal stress test twice at 260° C. for 30 seconds, and then the emission intensity was again measured. The voltage was 3.53 V, and the emission output was 4.2 mW, with no changes. Then, the LED device was subjected to the same temperature cycle as in Example 1, 300 times, and then the emission output was measured and found to be 4.2 mW, with no change.

Example 3

A composition comprising the liquid form perfluoro polymer (a-3) obtained in Synthesis Example 3 (70 parts), the compound (b-1) (24 parts), the compound (c-1) (5 parts), $CH_2=CHCH_2C_6F_{12}CH_2CH_2CH_2Si(OC_2H_5)_3$ (1 part) and $(C_6F_5C(O)O)_2$ (0.3 part), was prepared. Then, such a composition was heated at 60° C. for 20 minutes to obtain a syrup-form composition having a viscosity of about 50,000 cps (at room temperature). In the same manner as in Example 1, a plate-form cured product was formed from the syrup-form composition. Tg of the cured product was measured by DSC and found to be 0° C., and by increasing the content of the perfluoro polymer (a-3), Tg decreased, and flexibility increased. Further, light transmittance of the cured product at 460 nm was 91%.

By using the syrup-form composition, an LED device was encapsulated in the same manner as in Example 1. The emission intensity was measured by using an integral spherical form illuminance meter when 17.5 mA direct current was applied on the LED device. The voltage at the time of measuring was 3.53 V, and the emission output was 4.1 mW. Then, LED device was subjected to a thermal stress test twice at 260° C. for 30 seconds, and then the emission intensity was again measured. The voltage was 3.53 V, and the emission output was 4.1 mW with no changes. Then, after the temperature cycle was repeated 1,000 times in the same manner as in Example 1, the emission output was measured and found to be 4.0 mW, with no substantial change. It was evident that when the content of the perfluoro polymer (a-3) was high, the flexibility of the fluorinated cured product would be high, and the fluorinated cured product would be durable against stress generated along with the temperature change.

Comparative Example 1

A composition comprising the compound (b-1) (80 parts), the compound (c-1) (11 parts), $CH_2=CHCH_2C_6F_{12}CH_2CH_2CH_2Si(OC_2H_5)_3$ (3 part) and $(C_6F_5C(O)O)_2$ (0.2 part), was prepared. Then, such a composition was heated at 60° C. for 1 hour to obtain a syrup having a viscosity of from 100 to 200 cps. In the same manner as in Example 1, a plate-form cured product was formed from the syrup-form composition. Tg of the cured product was measured by DSC and found to be 115° C. Further, light transmittance of the cured product at 460 nm was 93%.

By using the syrup-form composition, an LED device was encapsulated in the same manner as in Example 1. The emission intensity was measured by using an integral spherical form illuminance meter when 17.5 mA direct current was applied on the LED device. The voltage was 3.58 V i.e. slightly increased as compared with the voltage of 3.52 V measured before encapsulation. The emission output was 3.8 mW. Then, the LED device was subjected to a thermal stress test twice at 260° C. for 30 seconds, and then the emission intensity was again measured. The voltage was 3.62 V, and the emission output was 3.1 mW, i.e. decreased. Then, the LED device was subjected to the same temperature cycle as in Example 1 10 times, followed by energizing, whereby the LED device no longer emitted light.

INDUSTRIAL APPLICABILITY

The curable composition provided by the present invention can form a fluorinated cured product in high reaction yield. Further, the fluorinated cured product in the present invention is excellent in transparency, light resistance (especially durability against a short wavelength light) and heat resistance, whereby it is useful as an optical material, especially as a material for lenses and sealing material for devices (especially light-emitting device and short wavelength light-emitting devices such as white LEDs.

The entire disclosure of Japanese Patent Application No. 2006-162172 filed on Jun. 12, 2006 including specification, claims, drawings and summary is incorporated herein by reference in its entirety.

What is claimed is:

1. A curable composition comprising a perfluoro polymer (a) containing a unit derived from a perfluorodiene having two polymerizable carbon-carbon double bonds, wherein two carbon atoms in one carbon-carbon double bond form the main chain, and the other carbon-carbon double bond forms a side chain; a perfluorocyclic monoene (b) having at least 8 carbon atoms, which has an alicyclic structure made of carbon atoms and optionally containing an oxygen atom, and one polymerizable carbon-carbon double bond, wherein at least one of two carbon atoms forming the carbon-carbon double bond is a carbon atom constituting the alicyclic structure; and a polymerization initiator (i).

2. The curable composition according to claim 1, which further contains a perfluorocyclic polyene (c) which has an alicyclic structure made of carbon atoms and optionally containing an oxygen atom, and at least two polymerizable carbon-carbon double bonds, wherein at least one of two carbon atoms forming at least one carbon-carbon double bond is a carbon atom constituting the alicyclic structure.

3. The curable composition according to claim 1, wherein the perfluoro polymer (a) has a content of the double bonds being from 0.1 to 2 mmol/g.

4. The curable composition according to claim 1, wherein the perfluoro polymer (a) has a mass average molecular weight of from 1,000 to 10,000.

5. The curable composition according to claim 1, wherein the perfluoro polymer (a) is a polymer further containing a unit derived from tetrafluoroethylene.

6. The curable composition according to claim 1, wherein the perfluorocyclic monoene (b) has an alicyclic structure made of a 5-membered ring or a 6-membered ring containing 1 or 2 oxygen atoms, wherein a carbon-carbon double bond is present between two adjacent carbon atoms constituting the alicyclic structure, or the carbon-carbon double bond is present between one carbon atom constituting the alicyclic structure and a carbon atom outside of the alicyclic structure.

7. A fluorinated cured product obtained by curing the curable composition as defined in claim 1.

8. An optical material made of the fluorinated cured product as defined in claim 7.

9. A light-emitting device which is encapsulated in a light-transmitting manner with the fluorinated cured product as defined in claim 7.

10. A curable composition comprising a perfluoro polymer (a) containing a unit derived from a perfluorodiene having two polymerizable carbon-carbon double bonds, wherein two carbon atoms in one carbon-carbon double bond form the main chain, and the other carbon-carbon double bond forms a side chain; a perfluorocyclic polyene (c) which has an alicyclic structure made of carbon atoms and optionally containing an oxygen atom, and at least two polymerizable carbon-carbon double bonds, wherein at least one of two carbon atoms forming at least one carbon-carbon double bond is a carbon atom constituting the alicyclic structure; and a polymerization initiator (i).

11. The curable composition according to claim 10, wherein the perfluoro polymer (a) has a content of the double bonds being from 0.1 to 2 mmol/g.

12. The curable composition according to claim 10, wherein the perfluoro polymer (a) has a mass average molecular weight of from 1,000 to 10,000.

13. The curable composition according to claim 10, wherein the perfluoro polymer (a) is a polymer further containing a unit derived from tetrafluoroethylene.

14. The curable composition according to claim 10, wherein the perfluorocyclic polyene (c) has an alicyclic structure made of a 5-membered ring or a 6-membered ring containing 1 or 2 oxygen atoms, wherein a carbon-carbon double bond is present between two adjacent carbon atoms constituting the alicyclic structure, or the carbon-carbon double bond is present between one carbon atom constituting the alicyclic structure and a carbon atom outside of the alicyclic structure, and the polyene (c) has two such alicyclic structures wherein the carbon-carbon double bond is present.

15. A fluorinated cured product obtained by curing the curable composition as defined in claim 10.

16. An optical material made of the fluorinated cured product as defined in claim 15.

17. A light-emitting device which is encapsulated in a light-transmitting manner with the fluorinated cured product as defined in claim 15.

* * * * *